(12) United States Patent
Janzen

(10) Patent No.: US 7,747,815 B2
(45) Date of Patent: Jun. 29, 2010

(54) METHOD AND CIRCUIT FOR ADJUSTING A SELF-REFRESH RATE TO MAINTAIN DYNAMIC DATA AT LOW SUPPLY VOLTAGES

(75) Inventor: Leel S. Janzen, Meridian, ID (US)

(73) Assignee: Round Rock Research, LLC, Mount Kisco, NY (US)

( * ) Notice: Subject to any disclaimer, the term of this patent is extended or adjusted under 35 U.S.C. 154(b) by 1287 days.

(21) Appl. No.: 11/255,243

(22) Filed: Oct. 20, 2005

(65) Prior Publication Data

US 2006/0039222 A1  Feb. 23, 2006

Related U.S. Application Data

(60) Division of application No. 10/685,997, filed on Oct. 14, 2003, now Pat. No. 7,013,363, which is a continuation of application No. 09/973,998, filed on Oct. 9, 2001, now Pat. No. 6,646,942.

(51) Int. Cl.
G06F 13/14 (2006.01)
G11C 7/00 (2006.01)

(52) U.S. Cl. .................... 711/106; 711/100; 711/154; 365/222

(58) Field of Classification Search .................. 711/100, 711/154, 105, 106; 365/183, 222, 189.09, 365/239
See application file for complete search history.

(56) References Cited

U.S. PATENT DOCUMENTS

| 5,400,289 | A | 3/1995 | Blodgett | 365/222 |
|---|---|---|---|---|
| 5,455,801 | A | 10/1995 | Blodgett et al. | 365/222 |
| 5,712,825 | A | 1/1998 | Hadderman et al. | 365/222 |
| 5,717,644 | A * | 2/1998 | Hadderman et al. | 365/222 |
| 5,801,982 | A | 9/1998 | Blodgett | 365/149 |
| 5,831,918 | A * | 11/1998 | Merritt et al. | 365/201 |
| 6,141,280 | A | 10/2000 | Cho | 365/222 |
| 6,199,139 | B1 | 3/2001 | Katayama et al. | 711/106 |
| 6,208,577 | B1 | 3/2001 | Mullarkey | 365/222 |
| 6,215,714 | B1 | 4/2001 | Takemae et al. | 365/222 |
| 6,252,816 | B1 | 6/2001 | Mullarkey | 365/222 |
| 6,421,281 | B2 | 7/2002 | Suzuki | 365/189.09 |
| 6,434,076 | B1 * | 8/2002 | Andersen et al. | 365/222 |
| 6,483,764 | B2 * | 11/2002 | Chen Hsu et al. | 365/222 |
| 6,603,696 | B2 | 8/2003 | Janzen | 365/222 |
| 6,603,697 | B2 | 8/2003 | Janzen | 365/222 |
| 6,603,698 | B2 | 8/2003 | Janzen | 365/222 |
| 6,903,994 | B1 | 6/2005 | Schoenfeld | 365/227 |
| 2001/0000450 | A1 | 4/2001 | Suzuki | 365/189.09 |

* cited by examiner

*Primary Examiner*—Tuan V. Thai
(74) *Attorney, Agent, or Firm*—Lerner, David, Littenberg, Krumholz & Mentlik, LLP

(57) ABSTRACT

A method and circuit for refreshing dynamic data stored in an integrated circuit are disclosed. The integrated circuit receives a supply voltage and operates in a self-refresh mode of operation to refresh the dynamic data at a refresh time that defines how often the dynamic data is refreshed during the self-refresh mode. The method includes monitoring a magnitude of the supply voltage and adjusting the refresh time as a function of the monitored magnitude of the supply voltage. The integrated circuit may be any type of integrated circuit that stores dynamic data, such as a memory device like a dynamic random access memory, DDR DRAM, SLDRAM, or RDRAM, or other type of integrated circuit such as a microprocessor.

15 Claims, 5 Drawing Sheets

METHOD AND CIRCUIT FOR ADJUSTING A SELF-REFRESH RATE TO MAINTAIN DYNAMIC DATA AT LOW SUPPLY VOLTAGES

CROSS-REFERENCE TO RELATED APPLICATIONS

This application is a divisional of U.S. patent application Ser. No. 10/685,997, filed Oct. 14, 2003, issued Mar. 14, 2006 as U.S. Pat. No. 7,013,363, which is a continuation of U.S. patent application Ser. No. 09/973,998, filed Oct. 9, 2001, issued Nov. 11, 2003 as U.S. Pat. No. 6,646,942.

TECHNICAL FIELD

The present invention relates generally to integrated circuits, and more specifically to refreshing dynamic data stored in an integrated circuit, such as a dynamic random access memory (DRAM), as a supply voltage applied to the integrated circuit varies.

BACKGROUND OF THE INVENTION

Many battery-powered portable electronic devices, such as laptop computers, Portable Digital Assistants, cell phones, and the like, require memory devices that provide large storage capacity and low power consumption. To reduce the power consumption and thereby extend the battery life in such devices, the devices typically operate in a low-power mode when the device is not being used. In the low-power mode, a supply voltage or voltages applied to electronic components such as a microprocessor, associated control chips, and memory devices are typically reduced to lower the power consumption of the components, as will be appreciated by those skilled in the art. Although the supply voltages are varied to reduce power consumption in the low-power mode, data stored in the electronic components such as the memory devices must be retained.

Because large storage capacity is typically desired to maximize the amount of available storage in portable devices, it is typically desirable to utilize dynamic random access memory (DRAM), which has a relatively large storage capacity, over other types of memories such as static random access memories (SRAM) and non-volatile memories such as FLASH memory. In a DRAM, the data is "dynamic" because the data stored in memory cells in the DRAM must be periodically recharged or "refreshed" to maintain the data, as will now be explained in more detail with reference to FIG. 1. FIG. 1 illustrates a portion of a conventional DRAM memory-cell array 100 including a plurality of memory cells 102 arranged in rows and columns, one of which is shown in FIG. 1. The memory cell 102 includes an access transistor 104 and a storage capacitor 106 connected in series between a digit line DL and a reference voltage VCC/2. The storage capacitor 106 includes a first conductive plate 107 coupled to the access transistor 104 and a second conductive plate 109 coupled to the reference voltage VCC/2.

A word line WL activates the access transistor 104 in the memory cell 102, and also activates the access transistors of all other memory cells (not shown) contained in the same row of the array 100 as the memory cell 102. To write data into the memory cell 102, a sense amplifier 108 drives the digit line DL and a complementary digit line DL* to complementary voltage levels corresponding to the data to be stored in the memory cell. The word line WL is then activated, turning ON the access transistor 104 and transferring charge through the access transistor to charge the storage capacitor 106 to the voltage level on the digit line DL corresponding to the data to be stored. The word line WL is thereafter deactivated, turning OFF the access transistor 104 and isolating the storage capacitor 106 from the digit line DL to thereby store the data in the form of a voltage across the storage capacitor.

To read data from the memory cell 102, the sense amplifier 108 equilibrates the digit lines DL, DL* to a predetermined voltage level and thereafter activates the word line WL to turn ON the access transistor 104. In response to the access transistor 104 turning ON, charge is transferred between the storage capacitor 106 and the digit line DL, causing the voltage on the digit line DL to be slightly higher or lower than the voltage on the digit line DL*. The sense amplifier 108 senses the difference between the voltages on the digit lines DL and DL* and drives the voltages on the digit lines to complementary levels in response to the sensed difference. For example, assume a voltage VCC/2 corresponding to a binary 1 is stored across the capacitor 106. In this situation, when the access transistor 104 is activated the equilibrated voltage on the digit line DL will increase slightly relative to the equilibrated voltage on the digit line DL*. As a result, the sense amplifier 108 will drive the voltage on the digit line DL to a supply voltage VCC and will drive the complementary digit line DL* to a reference voltage. The complementary voltages on the digit lines DL, DL* thus correspond to the data stored in the memory cell 102, and the sense amplifier 108 thereafter applies these signals to other circuitry (not shown) to thereby provide the circuitry with the data stored in the memory cell.

As previously mentioned, the data stored in the memory cell 102 in the form of the voltage across the capacitor 106 must be periodically refreshed. This is true because once the data is stored in the form of a voltage across the capacitor 106 and the access transistor 104 is deactivated, leakage currents ILK result in this stored voltage changing over time and, if not refreshed, may result in a different binary state of data being stored in the memory cell. These leakage currents ILK arise, for example, from the flow of charge stored on the conductive plate 107 of the capacitor 106 through the access transistor 104 even when the access transistor is turned OFF, and may also arise from the flow of charge from the conductive plates 107, 109 to ground, as well as the flow of charge from the plate 107 through a dielectric (not shown) to the plate 109, as will be appreciated by those skilled in the art. From the above description of the conventional DRAM memory cell 102, it is seen that each time data is read from the memory cell the storage capacitor 106 is again charged to the proper voltage corresponding to the data stored in the cell. Thus, to refresh memory cells 102, the memory cells are merely accessed as in a read operation with the sense amplifier 108 driving digit lines DL, DL* to complementary voltages corresponding to the data stored in the memory cell and thereby charging the storage capacitors 106 to the proper voltage.

The rate at which the data restored in the memory cells 102 must be periodically refreshed is known as the refresh rate of the cells, and is a function of a number of different parameters, including the operating temperature of the DRAM containing the array 100, the number of rows of memory cells in the array, and the value of the supply voltage VCC applied to the DRAM, as will be appreciated by those skilled in the art. For example, if the array 100 includes N rows of memory cells 102 and each memory cell must be refreshed every M milliseconds, the refresh rate is M/N milliseconds/row, meaning that one row must be accessed every M/N milliseconds in order to properly refresh the memory cells, with every row being accessed at least once every M milliseconds. As the supply voltage VCC decreases, the refresh rate increases due, for example, to a reduced voltage being stored across the storage capacitors 106 and the need to refresh this voltage more frequently to ensure the stored voltage does not decay to an insufficient level due to the leakage currents ILK. The refresh rate also must increase as the supply voltage VCC decreases due to the possibility of restoring incorrect data into the memory cell 102, as will be appreciated by those skilled in the art.

When the memory-cell array 100 is contained in a DRAM, a memory controller typically reads data from desired memory cells 102 in response to requests from a microprocessor or other control circuit, each accessed memory cell being automatically refreshed as previously described. The data stored in all the memory cells 102 and not just those accessed by the memory controller, however, must be periodically refreshed. As a result, during normal operation the memory controller will periodically apply a refresh command to the DRAM containing the array 100, causing control circuitry (not shown) to access each memory cell 102 as previously described and thereby refreshing the memory cells. Even when the memory controller is not accessing the DRAM, the memory cells 102 must still be periodically refreshed. To refresh the memory cells 102 in this situation, the memory controller applies a self-refresh command to the DRAM, placing the DRAM in a self-refresh mode of operation during which circuitry internal to the DRAM (not shown in FIG. 1) refreshes the memory cells 102 periodically, as will be appreciated by those skilled in the art.

As previously described, in portable and other electronic devices containing DRAM, the supply voltage VCC applied to the DRAM is typically reduced during a low-power mode of operation to reduce power consumption and extend battery life of the device. Notwithstanding the reduced supply voltage VCC, the memory cells in the DRAM must be adequately refreshed to ensure the integrity of the stored data. There is a need for an improved circuit and method for controlling the refresh rate of dynamic data stored in a DRAM or other integrated circuit when the supply voltage is reduced to a very low level during a low-power mode of operation.

SUMMARY OF THE INVENTION

According to one aspect of the present invention, a method and circuit for refreshing dynamic data stored in an integrated circuit are disclosed. The integrated circuit receives a supply voltage and operates in a self-refresh mode of operation to refresh the dynamic data at a refresh time that defines how often the dynamic data is refreshed during the self-refresh mode. The method includes monitoring a magnitude of the supply voltage and adjusting the refresh time as a function of the monitored magnitude of the supply voltage. The integrated circuit may be any type of integrated circuit that stores dynamic data, such as a memory device like a DRAM, double-data rate (DDR) DRAM, SLDRAM, RDRAM, or other type of integrated circuit such as a microprocessor.

DETAILED DESCRIPTION OF THE INVENTION

Figure 1:
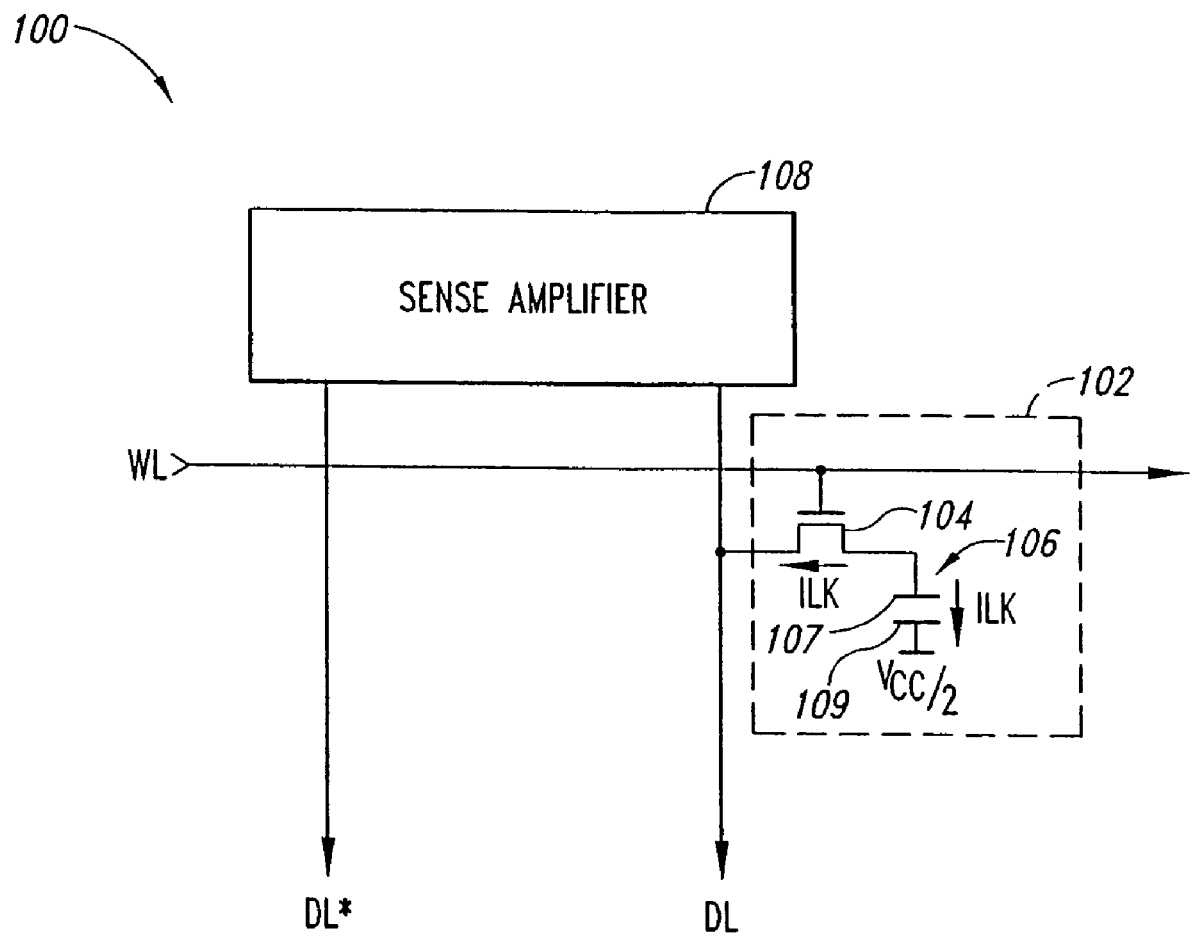
FIG. 1 is a diagram illustrating a portion of a memory-cell array in a conventional DRAM.
Figure 2:
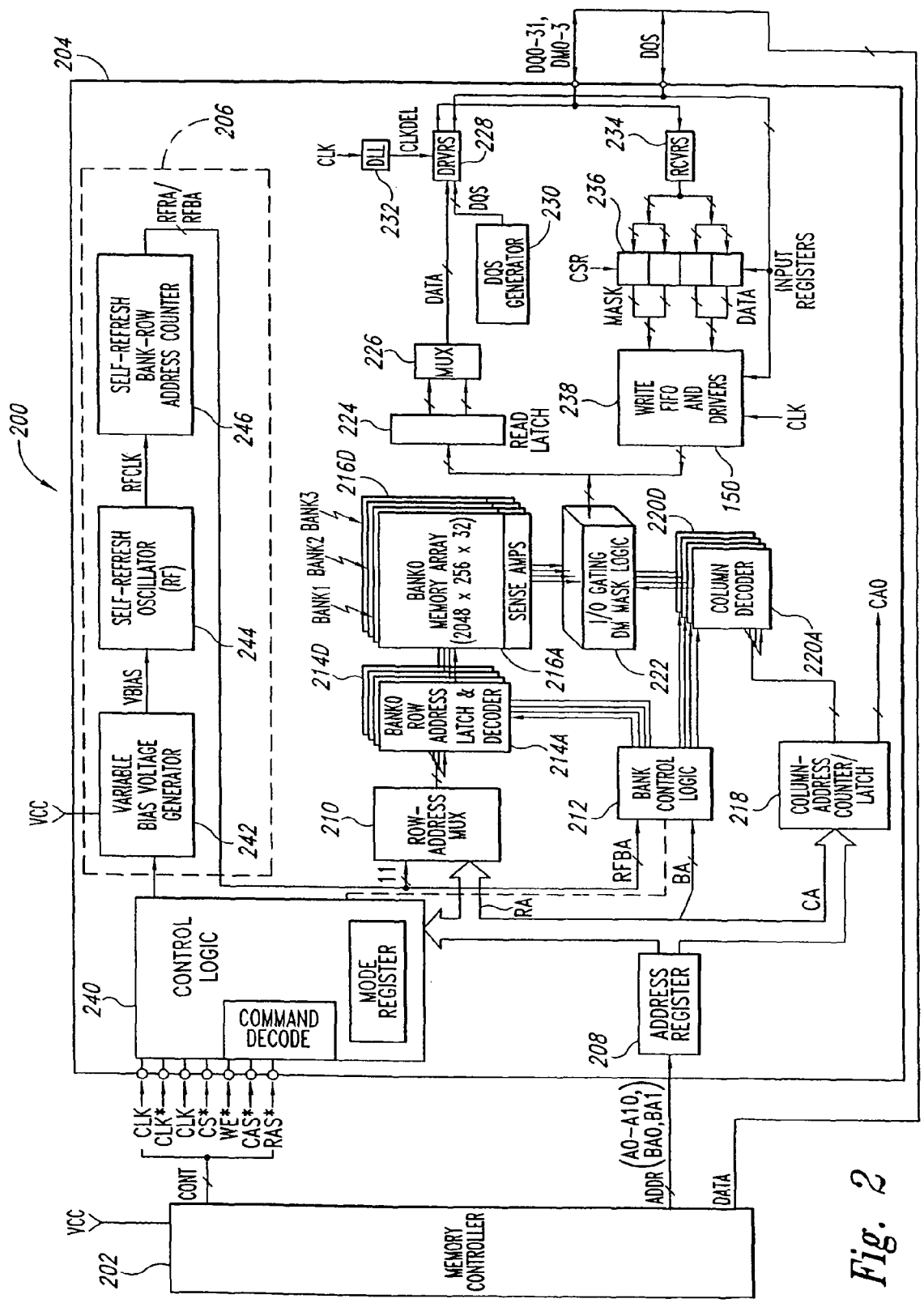
FIG. 2 is a functional block diagram of a memory system including a memory controller and a memory device including a self-refresh controller according to one embodiment of the present invention.

FIG. 2 is a functional block diagram of a memory system 200 including a memory controller 202 coupled to a memory device 204 that includes a self-refresh controller 206 for adjusting the refresh rate of dynamic data as a function of an applied supply voltage VCC according to one embodiment of the present invention. In operation, the self-refresh controller 206 adjusts a refresh frequency RF of a refresh clock signal RFCLK, which defines a refresh rate of the dynamic data as a function of the supply voltage VCC, to ensure the integrity of data as the supply voltage decreases, as will be explained in more detail below. The memory device 204 in FIG. 2 is a double-data rate (DDR) synchronous dynamic random access memory ("SDRAM"), although the principles described herein are applicable to any memory device containing memory cells that must be refreshed (i.e., that store dynamic data), such as conventional DRAMs and SDRAMs, as well as packetized memory device like SLDRAMs and RDRAMs, and are equally applicable to any integrated circuit that stores dynamic data. In the following description, certain details are set forth to provide a sufficient understanding of the invention. It will be clear to one skilled in the art, however, that the invention may be practiced without these particular details. In other instances, well-known circuits, control signals, timing protocols, and software operations have not been shown in detail or omitted entirely in order to avoid unnecessarily obscuring the invention.

Before describing the self-refresh controller 206 in more detail, the various components of the memory device 204 will first be described. The memory controller 202 applies row, column, and bank addresses to an address register 208 over an address bus ADDR. Typically, a row address RA and a bank address BA are initially received by the address register 208 and applied to a row address multiplexer 208 and bank control logic circuit 210, respectively. The row address multiplexer 208 applies either the row address RA received from the address register 208 or a refresh row address RFRA received from the self-refresh controller 206 to a plurality of row address latch and decoder circuits 214A-D. The bank control logic 212 activates the row address latch and decoder circuit 214A-D corresponding to either the received bank address BA or a refresh bank address RFBA from the self-refresh controller 206, and the activated row address latch and decoder circuit latches and decodes the received row address. In response to the decoded row address, the activated row address latch and decoder 214A-D applies various signals to a corresponding memory bank or array 216A-D to thereby activate a row of memory cells corresponding to the decoded row address. The data in the memory cells in the accessed row is stored in sense amplifiers coupled to the array 216A-D, which also refreshes the accessed memory cells as previously described. The row address multiplexer 210 applies the refresh row address RFRA to the row address latch and decoders 214A-D and the bank control logic circuit 212 uses the refresh bank address RFBA when the memory device 204 operates in an auto-refresh or self-refresh mode of operation in response to the controller 202 applying an auto- or self-refresh command to the memory device 204, as will be described in more detail below.

After the address register 208 memory controller 202 has applied the row and bank addresses RA, BA, the memory controller applies a column address CA on the address bus ADDR. The address register 208 provides the column address CA to a column address counter and latch circuit 218 which, in turn, latches the column address and applies the latched column address to a plurality of column decoders 220A-D. The bank control logic 212 activates the column decoder 220A-D corresponding to the received bank address BA, and the activated column decoder decodes the column address CA from the counter and latch circuit 218. Depending on the operating mode of the memory device 204, the counter and latch circuit 218 either directly applies the latched column address to the decoders 220A-D, or applies a sequence of column addresses to the decoders starting at the column address CA provided by the address register 208. In response to the column address from the counter and latch circuit 218, the activated column decoder 222A-D applies decode and control signals to an I/O gating and data masking circuit 222 which, in turn, accesses memory cells corresponding to the decoded column address in the activated row of memory cells in the array 216A-D being accessed.

During data read operations, data being read from the activated array 216A-D is coupled through the I/O gating and data masking circuit 222 to a read latch 224. The circuit 222 supplies N bits of data to the read latch 224, which then applies two N/2 bit words to a multiplexer 226. In the embodiment of FIG. 3, the circuit 222 provides 64 bits to the read latch 224 which, in turn, provides two 32 bits words to the multiplexer 226. A data driver circuit 228 sequentially receives the N/2 bit words from the multiplexer 226 and also receives a data strobe signal DQS from a strobe signal generator 230 and a delayed clock signal CLKDEL from a delay-locked loop (DLL) circuit 232. The DQS signal has the same frequency as the CLK, CLK* signals, and is used by the controller 202 in latching data from the memory device 204 during read operations, as will be described in more detail below. In response to the delayed clock signal CLKDEL, the data driver circuit 228 sequentially outputs the received N/2 bits words as corresponding data words DQ that are in synchronism with rising and falling edges of the CLK signal, respectively, and also outputs the data strobe signal DQS having rising and falling edges in synchronism with rising and falling edges of the CLK signal, respectively. Each data word DQ and the data strobe signal DQS collectively define a data bus DATA coupled to the controller 202 which, during read operations, latches the each N/2 bit DQ word on the DATA bus responsive to the data strobe signal DQS. As will be appreciated by those skilled in the art, the CLKDEL signal is a delayed version of the CLK signal, and the DLL circuit 232 adjusts the delay of the CLKDEL signal relative to the CLK signal to ensure that the DQS signal and the DQ words are placed on the DATA bus in synchronism with the CLK signal. The DATA bus also includes masking signals DQM0-X, which will be described in more detail below with reference to data write operations.

During data write operations, the memory controller 202 applies N/2 bit data words DQ, the strobe signal DQS, and corresponding data masking signals DM0-X on the data bus DATA. A data receiver circuit 234 receives each DQ word and the associated DM0-X signals, and applies these to an input register 236 that is clocked by the DQS signal. In response to a rising edge of the DQS signal, the input register 236 latches a first N/2 bit DQ word and the associated DM0-X signals, and in response to a falling edge of the DQS signal the input register latches the corresponding N/2 bit DQ word and associated DM0-X signals. The input register 236 provides the two latched N/2 bit DQ words as an N-bit word to a write FIFO and driver circuit 238, which clocks the the applied DQ word and DM0-X signals into the write FIFO and driver circuit in response to the DQS signal. The DQ word is clocked out of the write FIFO and driver circuit 238 in response to the CLK signal, and is applied to the I/O gating and masking circuit 222. The I/O gating and masking circuit 222 transfers the DQ word to the accessed memory cells in the activated array 216A-D subject to the DM0-X signals, which may be used to selectively mask bits or groups of bits in the DQ words (i.e., in the write data) being written to the accessed memory cells.

A control logic and command decoder circuit 240 receives a plurality of command and clocking signals from the memory controller 202 over a control bus CONT, and generates a plurality of control and timing signals to control the components 206-238 during operation of the memory device 204. The command signals include a chip select signal CS*, a write enable signal WE*, a column address strobe signal CAS*, and a row address strobe signal RAS*, while the clocking signals include a clock enable signal CKE* and complementary clock signals CLK, CLK*, with the "*" designating a signal as being active low. The memory controller 202 drives the command signals CS*, WE*, CAS*, and RAS* to values corresponding to a particular command, such as a read, write, or auto-refresh command. In response to the clock signals CLK, CLK*, the command decoder circuit 240 latches and decodes an applied command, and generates a sequence of control signals that control various components in the memory device to execute the function of the applied command. The clock enable signal CKE enables clocking of the command decoder circuit 240 by the clock signals CLK, CLK*. The command decoder circuit 240 latches command and address signals at positive edges of the CLK, CLK* signals (i.e., the crossing point of CLK going high and CLK* going low), while the input registers 236 and data drivers 228 transfer data into and from, respectively, the memory device 204 in response to both edges of the data strobe signal DQS and thus at double the frequency of the strobe signal and clock signals CLK, CLK*. For this reason the memory device 204 is referred to as a double-data-rate device, with data being transferred to and from the device at double the rate of a conventional SDRAM, which transfers data at a rate corresponding to the frequency of the applied clock signal. The detailed operation of the control logic and command generator circuit 240 in generating the control and timing signals is conventional, and thus, for the sake of brevity, will not be described in more detail.

As previously mentioned, in battery-powered electronic devices it is desirable to place the memory device 204 in a low-power mode of operation when the memory controller 202 is not accessing data stored in the memory device. In the memory device 204, this low-power mode of operation is known as a self-refresh mode. To place the memory device 204 in the self-refresh mode of operation, the memory controller 202 applies a self-refresh command to the memory device. In response to the self-refresh command, the command decoder circuit 240 applies control signals to the row address multiplexer 210 and the bank control logic circuit 212 that cause the circuits to utilize the refresh row address RFRA and refresh bank address RFBA from the self-refresh controller 206 to sequentially access each row of memory cells in the memory array 216A-D to thereby refresh the memory cells. The self-refresh controller 206 controls the refresh rate at which the memory cells in the arrays 216A-D0 are refreshed as a function of a supply voltage VCC applied to the memory device 204. The operation of the self-refresh controller 206 during the self-refresh mode along with the structure of the self-refresh controller will now be described in more detail.

The self-refresh controller 206 includes a bias voltage generator 242 that receives the supply voltage VCC and generates a bias voltage VBIAS having a value that is a function of the magnitude of the supply voltage. A self-refresh oscillator 244 receives the bias voltage VBIAS and generates a refresh clock signal RFCLK having a refresh frequency RF that is a function of the bias voltage VBIAS. The self-refresh oscillator 244 applies the refresh clock signal RFCLK to clock a self-refresh row-bank address counter 246 which sequentially generates the refresh row addresses RFRA and bank addresses RFBA in response to the RFCLK signal, and applies the refresh row address to the row address multiplexer 210 and refresh bank address to the bank control logic circuit 212 as previously described.

In operation, upon receiving a self-refresh command, the control logic and command decoder circuit 240 resets the counter 246 and applies control signals causing the row address multiplexer 210 and bank control logic circuit 212 to utilize the refreshed row address RFRA and refresh bank address RFBA, respectively. The self-refresh oscillator 244 applies the refresh clock signal RFCLK to clock the counter 246 which, in turn, sequentially generates the refresh row addresses RFRA and refresh bank addresses RFBA. The sequentially generated refresh row addresses RFRA are applied through the multiplexer 210 and latched and decoded by the activated row address latch and decoder circuit 214A-D, with the bank control logic circuit 212 activating the circuit 214A-D corresponding to the refresh bank address RFBA. The refresh controller 206 generates a given refresh bank address RFBA and then generates refresh row addresses RFRA to sequentially activate all rows in the memory array 216A-D corresponding to the bank address, and thereafter generates a new bank address and activates each row in the new memory array, and so on for each memory array. In this way, the refresh controller 206 sequentially activates rows of memory cells in the arrays 216A-D to thereby refresh the memory cells. Although the refresh controller 206 is discussed as generating addresses that refresh the memory cells during the self-refresh mode, one skilled in the art will appreciate that the control logic and command decoder circuit 240 also generates signals to control various components in the memory device 204 during this mode of operation.

The refresh rate of the memory cells in the arrays 216A-D is determined by the rate at which the counter 246 sequentially generates the refresh row and bank addresses RFRA, RFBA, which is determined by the frequency RF of the applied refresh clock signal RFCLK, as will be appreciated by those skilled in the art. Thus, the frequency RF of the RFCLK clock signal determines the refresh rate of the memory cells in the arrays 216A-D. As previously mentioned, the frequency RF of the RFCLK signal is a function of the bias voltage VBIAS from the variable bias voltage generator 242, and the bias voltage is a function of the magnitude of the supply voltage VCC. The refresh rate of the memory cells in the arrays 216A-D is therefore a function the magnitude of the supply voltage VCC. In this way, the self refresh controller 206 controls the refresh rate as a function of the supply voltage VCC to ensure the refresh rate is sufficient to reliably maintain the data stored in the arrays 216A'-D. For example, as the supply voltage VCC decreases during a low-power mode of operation, the self-refresh controller 206 increases the refresh rate of the memory cells in the arrays 216A-D to ensure data integrity.

In the self-refresh controller 206, the variable bias voltage generator 242 controls the bias voltage VBIAS as a function of the magnitude of the supply voltage VCC, and the bias voltage is applied to the self-refresh oscillator 244 to control the frequency RF of the RFCLK signal and thereby control the refresh rate of the memory cells in the arrays 216A-D as a function of the supply voltage VCC. Accordingly, the precise manner in which the variable bias voltage generator 242 controls the bias voltage VBIAS as a function of the supply voltage VCC and the precise manner in which the self-refresh oscillator 244 controls the frequency RF of the RFCLK signal in response to the bias voltage determine how the self refresh controller 206 controls the refresh rate as the supply voltage varies.

Figure 3A:
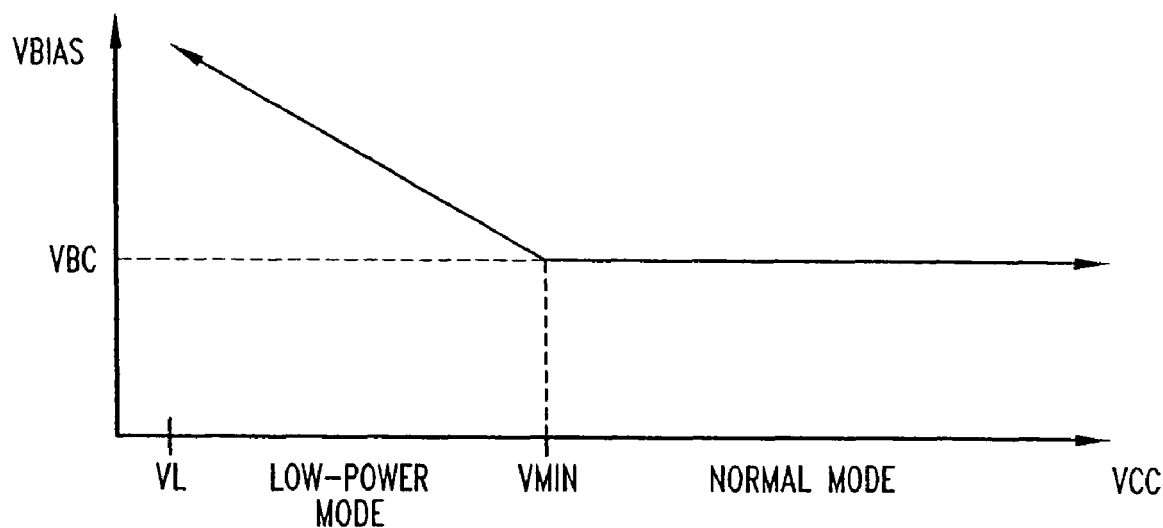
FIGS. 3A and 3B are diagrams illustrating signals generated by the self-refresh controller of FIG. 1 in controlling the frequency of a clock signal and thereby controlling a refresh rate of memory cells as a function of a supply voltage according to a first embodiment of the present invention.
Figure 3B:
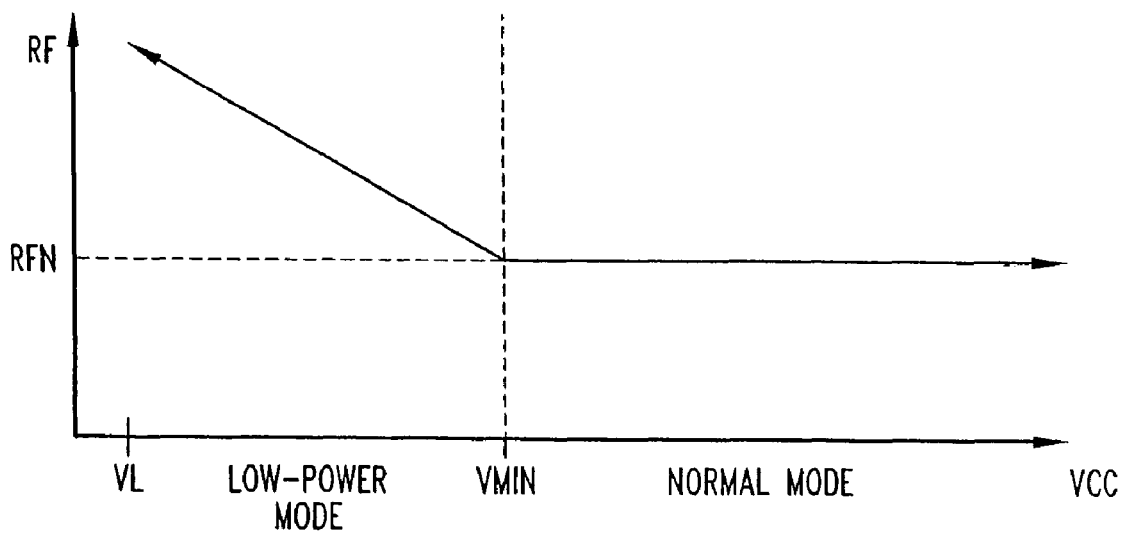

FIGS. 3A and 3B are signal diagrams illustrating the operation of the variable bias voltage generator 242 and self-refresh oscillator 244 in combination to control the frequency RF of the RFCLK signal as a function of the supply voltage VCC according to one embodiment of the present invention. In the embodiment of FIG. 3A, the variable bias voltage generator 242 maintains the bias voltage VBIAS at a relatively constant value VBC when the supply voltage VCC is greater than a minimum value VMIN. As seen in FIG. 3B, the relatively constant bias voltage VBC when the supply voltage VCC is greater than the voltage VMIN results in the oscillator 244 developing the RFCLK signal have a relatively constant frequency RFN. The supply voltage VCC being greater than the minimum value VMIN corresponds to a normal operating mode of the memory device 204. When the supply voltage VCC is less than or equal to the minimum value VMIN, the variable bias voltage generator 242 begins increasing the bias voltage VBIAS as the supply voltage decreases, which increases the frequency RF of the RFCLK signal and thereby increases the refresh rate of the memory cells in the arrays 216A-D. The supply voltage VCC being less than or equal to the minimum value VMIN and greater than a lower limit VL corresponds to a low-power operating mode of the memory device 204. Thus, in the embodiment of FIGS. 3A and 3B, the refresh rate is increased as the supply voltage VCC decreases below a minimum value VMIN to ensure data is adequately refresh during a low-power mode of operation. The lower limit VL corresponds to a supply voltage VCC having such a small magnitude that the refresh controller 206 can no longer reliably refresh data stored in the memory arrays 216A-D.

Figure 4:
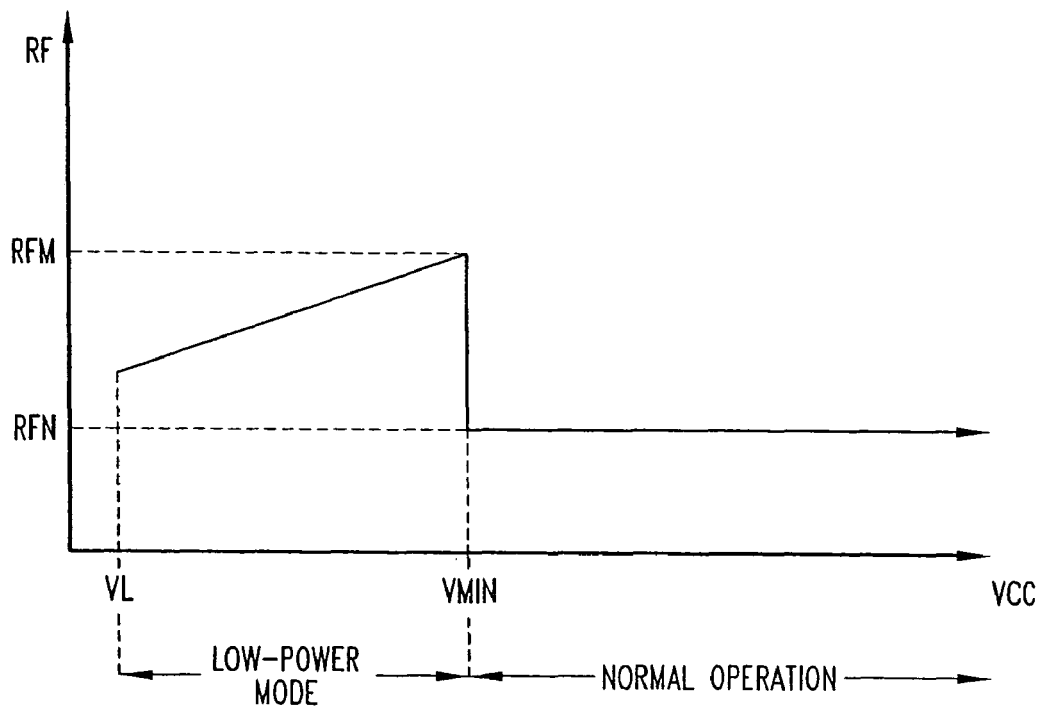
FIG. 4 is a signal diagram illustrating the operation of the self-refresh controller of FIG. 1 in controlling the frequency of a clock signal and thereby controlling a refresh rate of memory cells as a function of the supply voltage according to a second embodiment of the present invention.

FIG. 4 is a signal diagram illustrating the operation of the variable bias voltage generator 242 and the self-refresh oscillator 244 in combination to control the frequency RF of the RFCLK signal as a function of the supply voltage VCC according to a second embodiment of the present invention. In the embodiment of FIG. 4, the variable bias voltage generator 242 maintains the bias voltage VBIAS relatively constant when the supply voltage VCC is greater than a minimum value VMIN, resulting in the oscillator 244 maintaining the frequency RF of the RFCLK at a relatively constant value RFN. Once again, when the supply voltage VCC is greater than the minimum value VMIN the memory device 204 operates in a normal operating mode. In this embodiment, when the variable bias voltage generator 242 detects the supply voltage VCC is less than or equal to the minimum value VMIN, the voltage generator outputs the supply voltage as the bias voltage VBIAS. As seen in FIG. 4, when the supply voltage VCC is output as the bias voltage VBIAS, the frequency RF of the RFCLK signal increases to a maximum value RFM due to the increased magnitude of the bias voltage, and the refresh rate increases accordingly. The frequency RF and, accordingly, the refresh rate thereafter decrease as the supply voltage VCC and thus the bias voltage VBIAS decrease. The supply voltage VCC being less than or equal to the minimum value VMIN and greater than a lower limit VL once again corresponds to a low-power operating mode of the memory device 204. In the embodiment of FIG. 4, the magnitude of the bias voltage VBIAS is increased due to the greater magnitude of the supply voltage VCC, which is applied as the bias voltage. This increased bias voltage VBIAS increases the frequency RF of the RFCLK signal which, in turn, increases the refresh rate of the memory cells in the arrays 216A-D.

Figure 5:
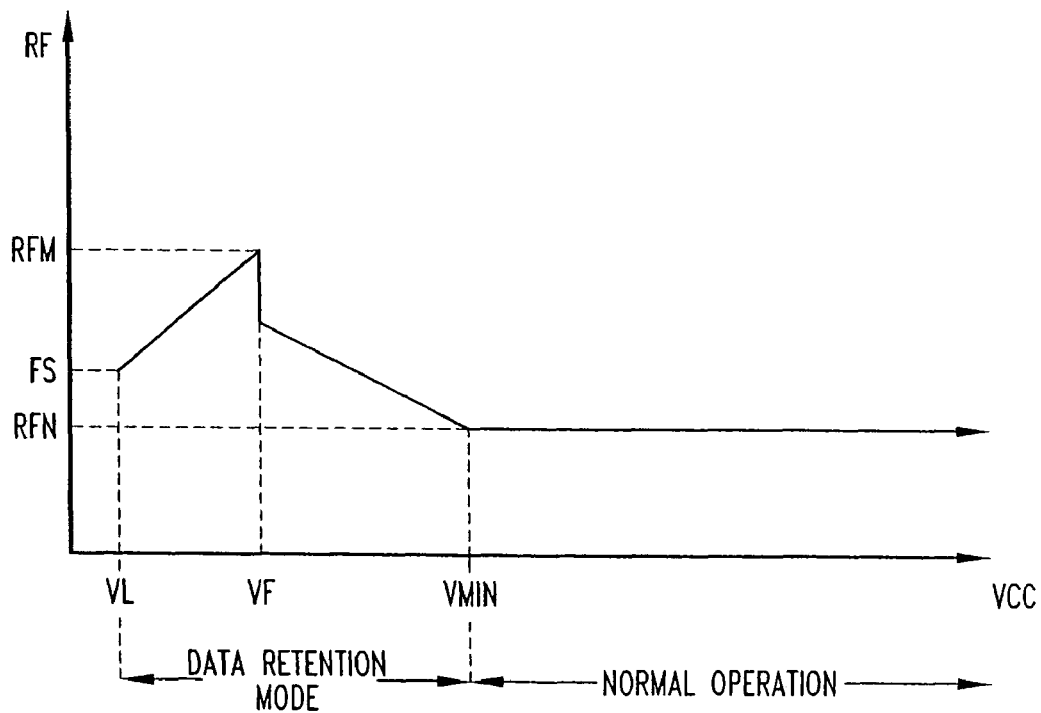
FIG. 5 is a signal diagram illustrating the operation of the self-refresh controller of FIG. 1 in controlling the frequency of a clock signal and thereby controlling a refresh rate of memory cells as a function of the supply voltage according to a third embodiment of the present invention.

FIG. 5 is a signal diagram illustrating the operation of the variable bias voltage generator 242 and the self-refresh oscillator 244 in combination to control the frequency RF of the RFCLK signal as a function of the supply voltage VCC according to a third embodiment of the present invention. In this embodiment, the variable bias voltage generator 242 maintains the bias voltage VBIAS at a relatively constant value VBC when the supply voltage VCC is greater than a minimum value VMIN to thereby cause the oscillator 244 to develop the RFCLK signal have a relatively constant frequency RFN. The supply voltage VCC being greater than the minimum value VMIN once again corresponds to a normal operating mode of the memory device 204. When the supply voltage VCC is less than or equal to the minimum value VMIN, the variable bias voltage generator 242 begins increasing the bias voltage VBIAS as the supply voltage decreases, which increases the frequency RF of the RFCLK signal and thereby increases the refresh rate of the memory cells in the arrays 216A-D. The variable bias voltage generator 242 and oscillator 244 operate in this way, which corresponds to the operation previously described with reference to FIGS. 3A and 3B, to increase the refresh rate as the supply Voltage VCC decreases.

The generator 242 and oscillator 244 operate in this manner until the variable bias voltage generator 242 detects the supply voltage VCC is less than a first lower limit VF. When the variable bias voltage generator 242 determines the supply voltage VCC is less than or equal to the first lower limit VF, the bias voltage generator operates as previously described with reference to FIG. 4, outputting the supply voltage as the bias voltage VBIAS to the oscillator 244. The increased magnitude of the supply voltage VCC being output as the bias voltage VBIAS causes the frequency RF of the RFCLK signal to increase to a maximum value RFM, and the refresh rate increases accordingly. The frequency RF and, accordingly, the refresh rate thereafter decrease as the supply voltage VCC and thus the bias voltage VBIAS decrease. The supply voltage VCC being less than or equal to the minimum value VMIN and greater than a second lower limit VL once again corresponds to a low-power operating mode of the memory device 204. It should be noted that in this embodiment, the low-power operating mode includes two sub modes, a first sub-mode corresponding to the operation of the generator 242 and oscillator 244 when the supply voltage VCC is between the minimum value VMIN and the first lower limit VF, and a second sub mode when the supply voltage is between the first lower limit VF and the second lower limit VL.

Referring back to FIG. 2, in another embodiment of the refresh controller 206, the memory controller 202 monitors the supply voltage VCC. When the memory controller 202 determines the supply voltage VCC is less than a minimum value VMIN, the memory controller applies a refresh rate adjustment command to the memory device 204. This refresh rate adjustment command may, for example, correspond to a load mode command that loads appropriate information into mode registers contained in the control logic and command decode circuit 240. In response to receiving the refresh rate adjustment command, the command decode circuit 240 applies control signals to the variable bias voltage generator 242, causing the voltage generator to operate as previously described for the embodiment of FIGS. 3A-3B. In this embodiment, the memory controller 202 could also further monitor the supply voltage VCC and send another refresh rate adjustment command to the memory device 204 when the supply voltage becomes less than a first lower limit VF, with the command decode circuit 240 thereafter causing the variable bias voltage generator 242 and oscillator 244 to operate as previously described for the embodiment of FIG. 5 when the supply voltage is between the first lower limit VF and the second lower limit VL. When the memory controller 202 applies this second refresh rate adjustment command, the refresh controller 202 operates the same as in the embodiment of FIG. 4.

As will be appreciated by those skilled in the art, other embodiments of the refresh controller 206 in which the refresh controller controls the refresh rate in different ways as a function of the magnitude of the supply voltage VCC are well within the scope of the present invention.

Figure 6:
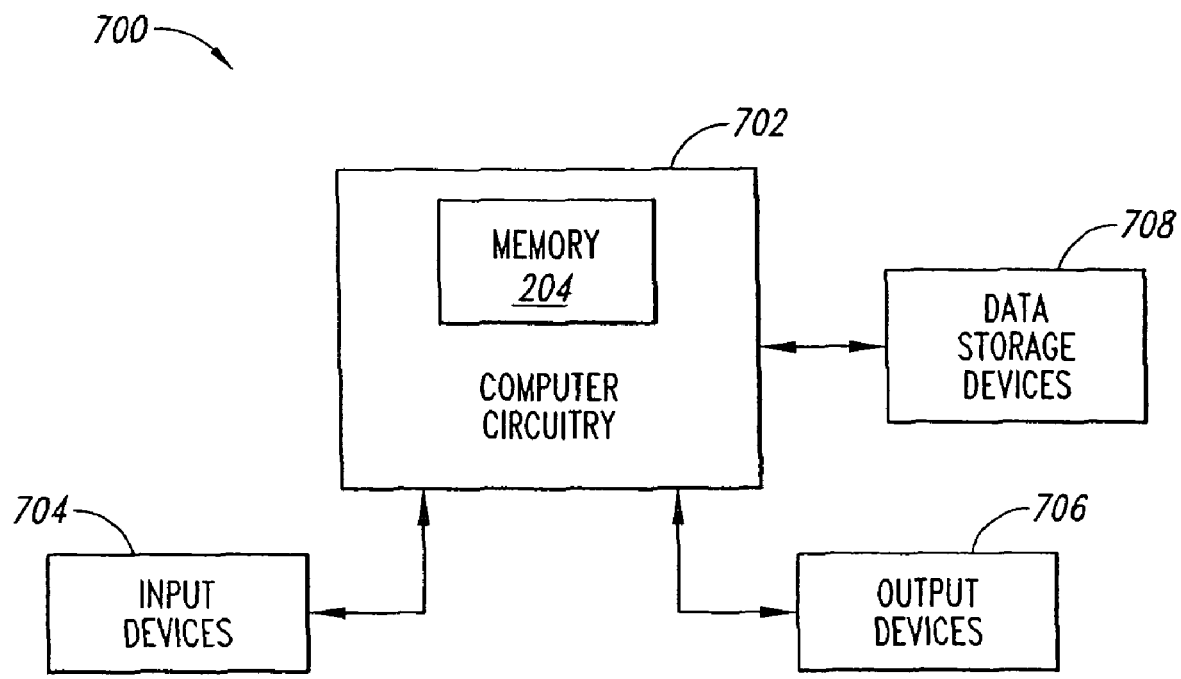
FIG. 6 is a functional block diagram illustrating a computer system including the memory device of FIG. 2.

FIG. 6 is a block diagram of a computer system 700 including computer circuitry 702 which includes the memory device 204 of FIG. 2, and which may also include of the memory controller 202 of FIG. 2 as well. Typically, the computer circuitry 702 is coupled to the memory controller 202 through address, data, and control buses to provide for writing data to and reading data from the memory device 204. The computer circuitry 702 includes circuitry for performing various computing functions, such as executing specific software to perform specific calculations or tasks. In addition, the computer system 700 includes one or more input devices 704, such as a keyboard or a mouse, coupled to the computer circuitry 702 to allow an operator to interface with the computer system. Typically, the computer system 700 also includes one or more output devices 706 coupled to the computer circuitry 702, such as output devices typically including a printer and a video terminal. One or more data storage devices 708 are also typically coupled to the computer circuitry 702 to store data or retrieve data from external storage media (not shown). Examples of typical storage devices 708 include hard and floppy disks, tape cassettes, compact disk read-only (CD-ROMs) and compact disk read-write (CD-RW) memories, and digital video disks (DVDs).

It is to be understood that even though various embodiments and advantages of the present invention have been set forth in the foregoing description, the above disclosure is illustrative only, and changes may be made in detail, and yet remain within the broad principles of the invention. For example, many of the components described above may be implemented using either digital or analog circuitry, or a combination of both, and also, where appropriate, may be realized through software executing on suitable processing circuitry. Therefore, the present invention is to be limited only by the appended claims.

The invention claimed is:

1. In a memory device, a method of refreshing dynamic data stored in an integrated circuit of the memory device, the method comprising:
   receiving an input voltage, the input voltage having a variable voltage magnitude; and refreshing the dynamic data at a constant first rate when the voltage magnitude is within a first range and at a variable second rate different than the first rate when the voltage magnitude is within a second range that is at least partially different from the first range, wherein the first range of the voltage magnitude is not overlapping with the second range of the voltage magnitude.

2. The method of claim 1 wherein the second range comprises a range lower than the first range in magnitude, and wherein the variable second rate comprises a function of the voltage magnitude.

3. The method of claim 1 wherein the second range comprises a range lower than the first range in magnitude, and wherein the variable second rate comprises a function of the voltage magnitude such that the variable second rate increases as the voltage magnitude decreases.

4. The method of claim 1, further comprising refreshing the dynamic data at a third rate different than the constant first and variable second rates when the voltage magnitude is within a third range that is at least partially different from the first and second ranges.

5. A memory device in which data is stored and is refreshed when in a refresh mode, the memory device comprising:
   a memory array operable to store the data; and
   a refresh controller coupled to the memory array and receiving an input voltage having an input voltage magnitude that varies within a voltage range, the refresh controller operable to cause the data to be refreshed at a refresh rate that varies inversely in response to the input voltage magnitude,
   the refresh rate including a first rate when the input voltage magnitude is within a first portion of the voltage range, and wherein the refresh rate including a second rate different than the first rate when the input voltage magnitude is within a second portion of the voltage range not overlapping the first portion of the voltage range.

6. The memory device of claim 5 wherein the second rate is a function of the input voltage magnitude.

7. The memory device of claim 5 wherein the refresh rate comprises a third rate when the input voltage magnitude is within a third portion of the voltage range not overlapping the first and second portions of the voltage range, the third rate being different than the first and second rates.

8. A memory device, comprising:
   an array of memory cells operable to store dynamic data; and
   control logic coupled to the memory array and a supply voltage, the control logic operable to refresh the memory cells at a refresh rate, the control logic further operable to adjust the refresh rate according to a supply voltage level of the supply voltage so that the refresh rate is adjusted to a first rate when the supply voltage level is in a first range above a first threshold level and to a second rate different than the first rate when the supply voltage level is in a second range below the first threshold level, the second rate a function of the supply voltage level such that the second rate increases as the supply voltage level decreases,
   wherein the first range of the supply voltage level is not overlapping with the second range of the supply voltage level.

9. The memory device of claim 8 wherein the second rate comprises a function of the supply voltage level.

10. The memory device of claim 8 wherein the control logic is further operable to adjust the refresh rate to a third rate different than the second rate when the supply voltage level is below a second threshold level that is lower than the first threshold level.

11. The memory device of claim 10 wherein the third rate comprises a function of the supply voltage level.

12. An electronic device, comprising:
    an input device;
    an output device;
    a processor coupled to the input and output devices; and
    a memory device coupled to the processor, the memory device including:
       a memory array operable to store data;
       a control subsystem coupled to the memory array and receiving control signals, the control subsystem operable to store data in and retrieve data from the memory array in response to the control signals; and
       a refresh controller coupled to the control subsystem and receiving an input voltage having an input voltage level that varies within a range, the refresh controller operable to refresh the data at a constant first rate when the input voltage level is within a first portion of the range and at a variable second rate when the input voltage level is within a second portion of the range that is at least partially different from the constant first portion of the range,
       wherein the first portion of the range of the input voltage level is not overlapping with the second portion of the range of the input voltage level.

13. The electronic device of claim 12 wherein the variable second rate comprises a function of the input voltage level.

14. The electronic device of claim 12 wherein the variable second rate comprises a function of the input voltage level such that the variable second rate increases as the input voltage level decreases.

15. The electronic device of claim 12 wherein the refresh controller is further operable to refresh the data at a third rate when the input voltage level is within a third portion of the range not overlapping the first and second portions of the range.

* * * * *

UNITED STATES PATENT AND TRADEMARK OFFICE
CERTIFICATE OF CORRECTION

Page 1 of 1

PATENT NO.       : 7,747,815 B2
APPLICATION NO.  : 11/255243
DATED            : June 29, 2010
INVENTOR(S)      : Leel S. Janzen It is certified that error appears in the above-identified patent and that said Letters Patent is hereby corrected as shown below:

Column 4, line 34, "device" should read --devices--.
Column 4, line 52, after "either" insert --to--.
Column 6, line 10, cancel the second occurrence of "the".
Column 11, claim 5, line 34, "including" should read --includes--.
Column 12, claim 8, line 57, after "rate" insert --being--.

Signed and Sealed this
Third Day of April, 2012

David J. Kappos
*Director of the United States Patent and Trademark Office*